United States Patent [19]
Tikhonov

[11] Patent Number: 5,967,889
[45] Date of Patent: Oct. 19, 1999

[54] FIXTURE FOR MECHANICAL GRINDING AND INSPECTION OF FAILED OR DEFECTIVE SEMICONDUCTOR DEVICES

[75] Inventor: Victor Tikhonov, San Antonio, Tex.

[73] Assignees: Sony Corporation, Tokyo, Japan; Sony Electronics, Inc., Park Ridge, N.J.

[21] Appl. No.: 08/857,833

[22] Filed: May 16, 1997

[51] Int. Cl.[6] .................................................. B24B 41/06
[52] U.S. Cl. ........................ 451/386; 451/387; 451/391; 29/557
[58] Field of Search ..................... 29/428, 557; 451/41, 451/278, 386, 387, 389, 391, 405

[56] References Cited

U.S. PATENT DOCUMENTS 2,484,574  10/1949  Leiman .
2,654,979  10/1953  Grodzinski et al. .
4,850,157   7/1989  Holmstrand .
4,876,826  10/1989  Denboer .
5,272,844  12/1993  Burgess et al. .

*Primary Examiner*—Timothy V. Eley
*Attorney, Agent, or Firm*—Ronald P. Kananen; Rader, Fishman & Grauer

[57] ABSTRACT

A fixture for holding a semiconductor chip during a polishing process can be made to also hold the chip while the chip is inspected by a scanning electron microscope. In this manner, the polishing of the chip may be inspected and monitored without removing the chip from the polishing fixture. This allows polishing to be resumed, if necessary, with more precision. This results because the position of the chip with respect to the polishing fixture has not been altered by removing and then resecuring the chip as would be otherwise necessary for microscopic inspection of the chip.

17 Claims, 2 Drawing Sheets

FIXTURE FOR MECHANICAL GRINDING AND INSPECTION OF FAILED OR DEFECTIVE SEMICONDUCTOR DEVICES

FIELD OF THE INVENTION

The present invention relates generally to the field of semiconductor device manufacture and failure analysis. More specifically, the present invention relates to the field of polishing semiconductor substrates to expose a cross-section of a failed device or defect and to the field of monitoring the polishing process.

BACKGROUND OF THE INVENTION

In the world of modern technology, electronic circuits and circuit elements formed on semiconductor chips are ubiquitous. A semiconductor chip may be found controlling a battery-powered toy, a home stereo or a computerized fuel injection system.

Semiconductor chip technology allows circuits to be miniaturized because microscopic circuit elements and electrical connections between those elements can be formed directly on the chip. This process typically includes successively depositing several layers of different materials on the semiconductor chip that are need to form connections and circuit elements. When necessary, most of the deposited layer or layers can be chemically removed from the chip, leaving material behind only in those places where it will be used to form a circuit element or electrical connection.

Because semiconductor chips are mass-produced, when a defect in the chip is discovered or a circuit element on the chip does not function properly or at all, the cause of the problem must be determined and corrected or it is likely to recur. Accordingly, when a defect or a non-functional circuit element is identified on a semiconductor chip, it must be inspected.

The inspection is carried out by breaking the chip as near the defect or non-functioning circuit element as possible, and then grinding and fine polishing the edge of the chip to expose a cross-section of the defect or the layers of the non-functioning circuit element. The defect or non-functioning circuit element can then be inspected with a microscope to determine the cause of the problem.

The difficulty in the process is polishing the chip with microscopic precision so that the polishing is halted when the desired cross-section of the defect or non-functioning element is exposed. If the polishing is continued too long, the area to be inspected may easily be completely polished away.

Accordingly, during the polishing process, the chip must be periodically inspected with a microscope to determine how much more polishing will expose a cross-section of the defect or non-functioning circuit element for inspection.

Usually the polishing process is accomplished by attaching the semiconductor chip to be polished to a polishing fixture. The polishing fixture then holds the substrate against the surface of a polishing wheel which is rotating in a horizontal plane. The friction between the wheel and the substrate polishes the chip as needed.

In the initial stage of polishing, inspection with an optical microscope may suffice. However, to monitor the end of the polishing process, the chip must be removed from the polishing fixture and viewed with a scanning electron microscope. Once removed from the polishing fixture, the chip is secured to a microscope fixture and inserted in the scanning electron microscope. With the aid of the microscope, it can be determined if the polishing process has been completely and accurately accomplished.

If the polishing is not complete and the cross-section of the defect or non-functioning circuit element is not exposed, the chip must be returned to the polishing fixture for further polishing. It is desirable to be able to fine adjust the rate of polishing to save time. However, it is impossible to resecure the chip to the polishing fixture in precisely the same microscopic relationship that previously existed between the polishing fixture and the chip.

Accordingly, because the precise position of the chip with respect to the polishing fixture has changed, when polishing is resumed, the information obtained from viewing the chip with the scanning electron microscope as to the amount and pattern of further polishing required cannot be implemented precisely. The unknown shift in the position of the chip with respect to the polishing fixture renders the polishing process more imprecise.

Accordingly, there exists a need in the art for a means and method of fine adjustment of the polishing rate and monitoring a semiconductor chip during polishing without altering its position with respect to the polishing fixture.

OBJECTS OF THE INVENTION

Accordingly it is an object of the present invention to meet the above-described needs and others. It is an object of the present invention to provide a means and method of fine adjustment of the polishing rate and monitoring a semiconductor chip during polishing without altering its position with respect to the polishing fixture. It is an object of the present invention to provide a polishing fixture which can provide fine pressure adjustment, and be removed from a polishing station and inserted in a scanning electron microscope with the chip being polished still secured thereto.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve the stated and other objects of the present invention, as embodied and described below, the invention may encompass a polishing fixture for holding a semiconductor chip during polishing having: a grinding/polishing fixture body; means for securing the chip to the fixture body in an orientation in which the chip may be polished when the fixture body is disposed at a polishing station; means for adjusting polishing pressure by applying a polishing rate adjusting weight in various orientations to the fixture body; and means provided on the fixture body for securing the fixture to a microscope in an orientation in which the chip can be inspected with the microscope.

The fixture of the present invention may also include spacer means attached to an underside of the fixture body for spacing the fixture body from a polishing surface when the fixture body is disposed at the polishing station; and means for adjusting the angle of the fixture body with respect to a polishing surface of the polishing station. Other modifications of existing fixtures can be incorporated, such as adjusting pads which do not contact the polishing wheel.

The fixture of the present invention may also be described as a polishing fixture for holding a semiconductor chip during polishing having: a polishing fixture body; a chip pad for securing the chip to the fixture body in an orientation in which the chip may be polished when the fixture body is disposed at a polishing station; and a groove provided in the upper surface of the fixture body for accepting a polishing rate adjusting weight in various orientations and for securing the fixture to a microscope in an orientation in which the chip can be inspected with the microscope. Opposite sides of the groove may be undercut.

The fixture of the present invention may also include spacer pads attached either to an underside of the fixture body for spacing the fixture body from a polishing surface when the fixture body is disposed at the polishing station, or to the rear end of the fixture, in which case a bar supporting the fixture is used; and angle adjusting screws for adjusting the angle of the fixture body with respect to a polishing surface of the polishing station.

The present invention also encompasses a method of polishing and monitoring the polishing of a semiconductor chip by observing a polished edge of the chip with a microscope while the chip remains secured to a polishing fixture with which the polishing was performed.

This observing is made possible by removably mounting the polishing fixture to the microscope in an orientation in which the chip can be observed with the microscope. The observing is followed by removing the fixture from the microscope and resuming polishing of the chip based on the observation, and controlling the resumed polishing by adjusting means provided on the fixture for controlling the angle and pressure between the fixture and a polishing surface.

The present method also includes fine adjusting the polishing rate by changing the position or orientation of a polishing rate adjusting weight which applies force to the fixture during polishing.

The present invention also encompasses a method of making a fixture for polishing and inspecting a chip by: forming a fixture body; forming a semiconductor pad located on the fixture body for securing a semiconductor chip to the fixture body; and forming means on the fixture body for removably mounting the fixture to a microscope in an orientation in which the chip can be observed by the microscope.

The step of forming means on the fixture body for removably mounting the fixture to a microscope may include forming a groove in a surface of the fixture; and undercutting opposite sides of the groove.

BRIEF DESCRIPTION OF THE DRAWINGS

The accompanying drawings illustrate the present invention and are a part of the specification. Together with the following description, the drawings demonstrate and explain the principles of the present invention. In the drawings.

DETAILED DESCRIPTION OF THE PREFERRED EMBODIMENT

According to the principles of the present invention, a polishing fixture will be described which can be removed from a polishing station and inserted in a scanning electron microscope so that the polishing of the chip may be inspected without removing the chip from the fixture.

Figure 1:
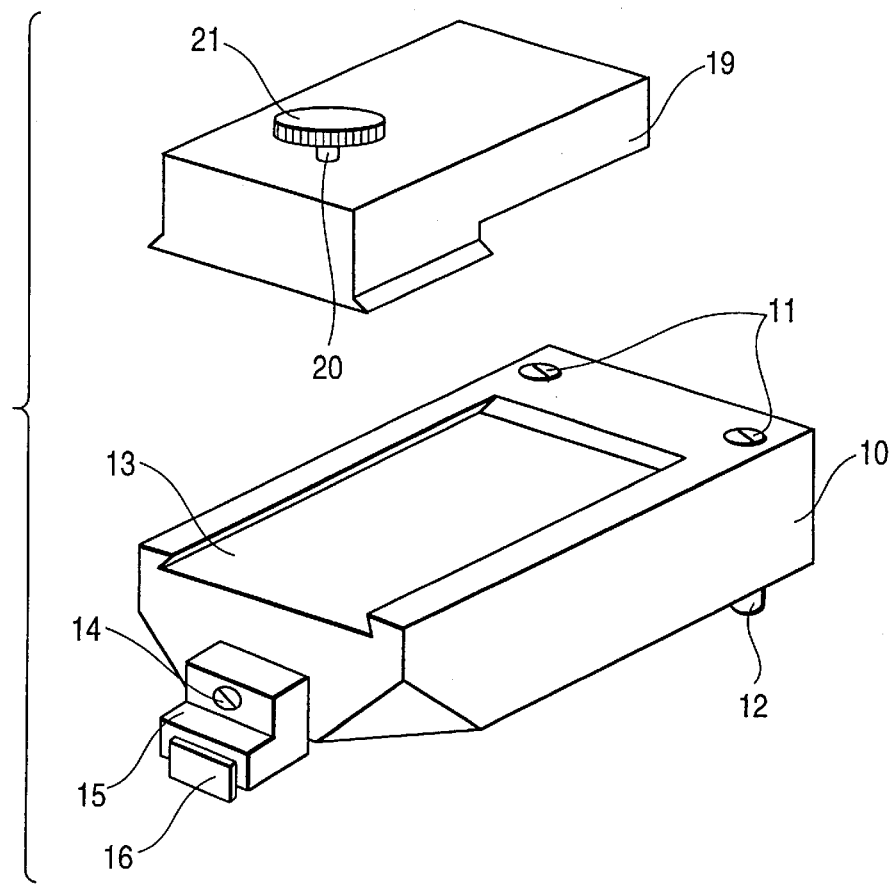
FIG. 1 illustrates a polishing fixture according to the principles of the present invention.

FIG. 1 illustrates an embodiment of the polishing fixture 10 of the present invention. At the front of the fixture 10 is a chip pad 15 to which a chip 16 to be polished is glued. The chip pad 15 is secured to the fixture 10 by a set screw 14. At the rear of the fixture 10 are angle adjusting screws 11 and spacer pads 12. The spacer pads 12 are preferably made from teflon. Alternatively, the fixture may be supported by the bar 18.

Figure 2:
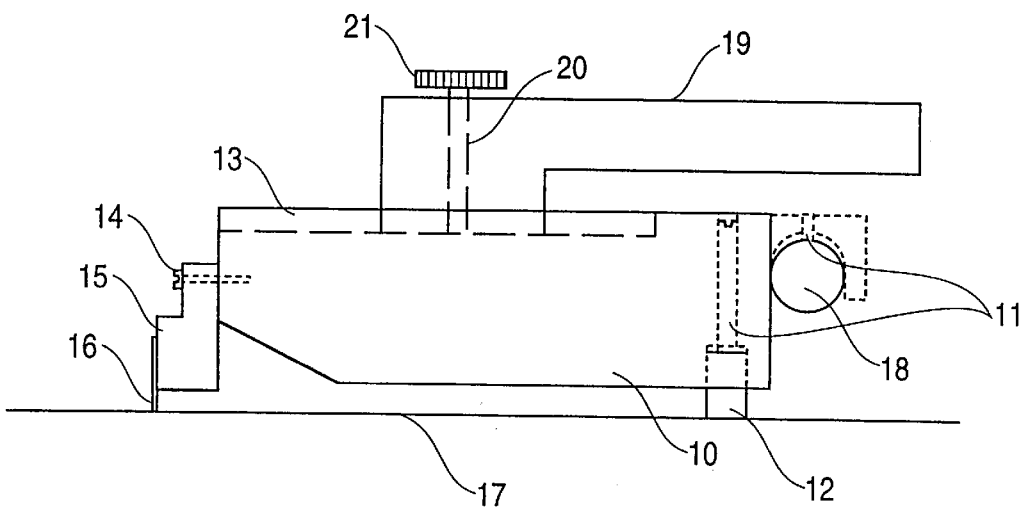
FIG. 2 illustrates the polishing fixture of FIG. 1 as viewed from the side.

FIG. 2 illustrates the polishing fixture 10 as viewed from the side when located at a polishing station. As illustrated in FIG. 2, the polishing station includes a polishing wheel 17 which rotates in a horizontal plane. The spacer pads 12 and the chip 16 to be polished are brought into contact with the surface of the polishing wheel 17 during polishing. The polishing wheel 17 rotates to cause friction between its surface and the chip 16. This friction polishes the edge of chip 16 to expose the defective portion of the chip of the failed circuit element.

The angle made by the length and width of the polishing fixture 10 and the surface of the polishing wheel 17 may be controlled by adjusting the angle screws 11. Accordingly, adjustment of the angle adjusting screws 11 controls the initial polishing position of the chip 16.

As shown in both FIGS. 1 and 2, the fixture 10 is provided with a groove 13 on its upper surface. The sides of this groove 13 are preferably undercut as illustrated in FIG. 1. When the fixture 10 is removed from the polishing station, depicted in FIG. 2, it can be placed in a scanning electron microscope (not shown) while still holding the chip 16.

The fixture 10 is removably secured in the microscope by groove 13. The microscope will have a coupling member which mates with groove 13 to secure the fixture 10 in the microscope. Once secured in the microscope, the polishing of the chip 16 can be inspected and monitored with the microscope. In this manner, the chip 16 can be observed with the scanning electron microscope without being transferred from the polishing fixture 10 to a microscope fixture.

Because the chip 16 remains attached to the fixture 10 throughout the inspection process, it remains in precisely the same position with respect to the fixture 10. Accordingly, when the fixture 10 and chip 16 are returned to the polishing station and polishing wheel 17, the precise pattern and extent of further polishing required can be executed with more precision because no unmeasured shift in the position of the chip 16 with respect to the fixture 10 has occurred.

The polishing rate may be controlled by using a polishing rate adjusting weight 19. Weight 19 is secured in the groove 13 by a set screw 20. The screw 20 is topped by a knob 21 for easy manipulation by hand. By changing the position and orientation of the weight 19, one can adjust the polishing rate of the chip 16. The weight 19 is, of course, removed during inspection of the chip 16 with the microscope and reattached to the fixture 10 as needed to adjust and control the polishing process.

FIG. 3 illustrates how various orientations and positions of the weight 19 can apply a range of pressures to the chip 16 being polished. FIG. 3A illustrates the least amount of pressure applied to the chip 16. FIG. 3B illustrates that pressure on the chip 16 may be increased by sliding the weight 19 toward the chip 16 secured on fixture 10.

Figure 3A:
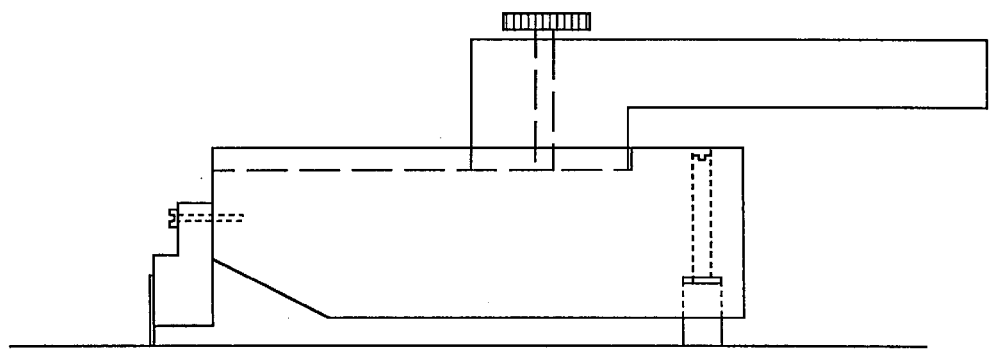
FIGS. 3A to 3D illustrate various positions and orientations of a polishing rate adjusting weight on the polishing fixture of the present invention.
Figure 3B:
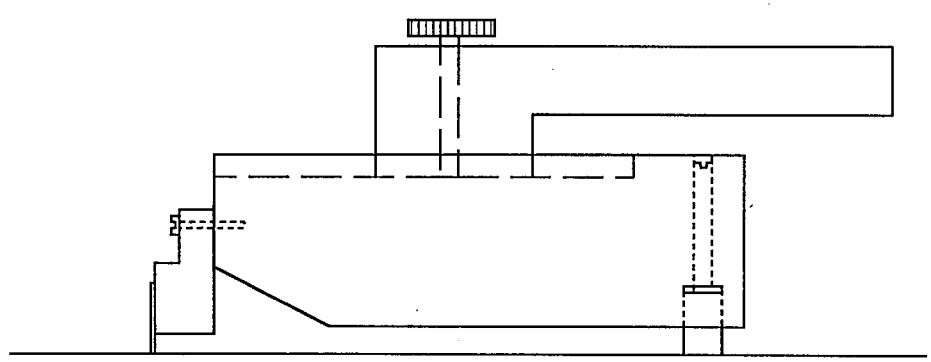
Figure 3C:
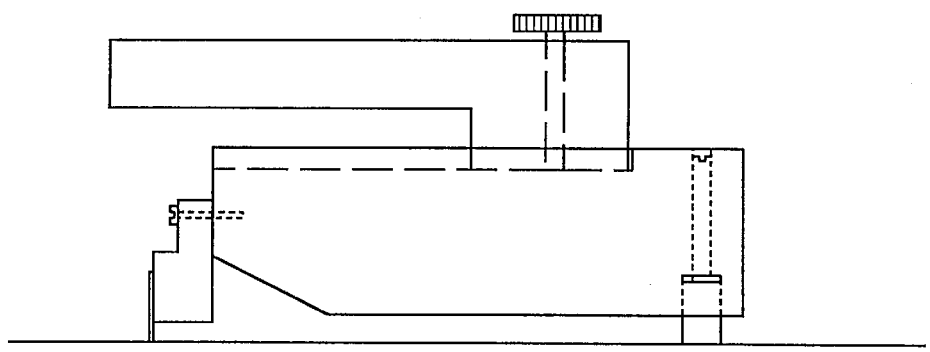
Figure 3D:
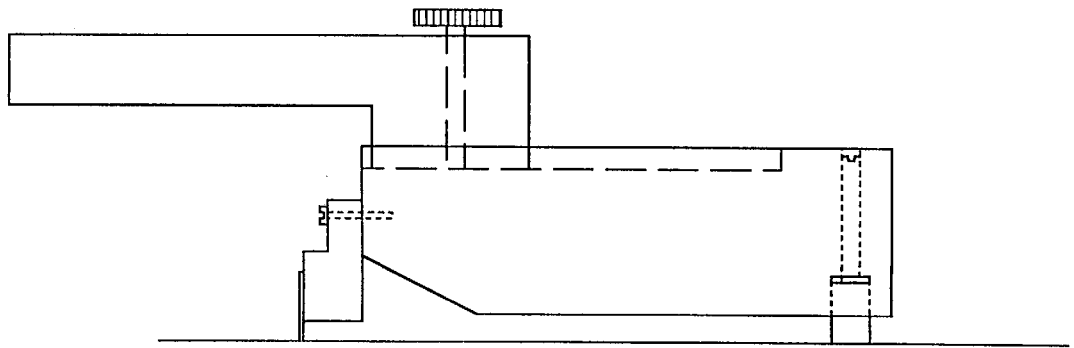

FIG. 3C illustrates that the pressure on the chip 16 may be further increased by reorienting the weight 19 as shown. Finally, FIG. 3D illustrates the position and orientation of the weight 19 which applies the maximum pressure to the chip 16.

While the preceding preferred embodiment discloses groove 13 as the means of securing the fixture 10 in a scanning electron microscope, those skilled in the art will appreciate that any equivalent means of mating the fixture 10 to a microscope may be employed. The size, shape and positioning of groove 13 will likely be dictated by the means provided in the scanning electron microscope for mating with a microscope fixture.

The preceding description has been presented only to illustrate and describe the invention. It is not intended to be exhaustive or to limit the invention to any precise form disclosed. Many modifications and variations are possible in light of the above teaching. The preferred embodiment was chosen and described in order to best explain the principles of the invention and its practical application.

The preceding description is intended to enable others skilled in the art to best utilize the invention in various embodiments and with various modifications as are suited to the particular use contemplated. It is intended that the scope of the invention be defined by the following claims.

What is claimed is:

1. A polishing fixture for holding a semiconductor chip during polishing comprising:

a polishing fixture body;

a chip pad removably mounted on said polishing fixture body for receiving said chip and securing said chip to said fixture body in an orientation in which said chip may be polished when said fixture body is disposed at a polishing station; and a groove provided in the upper surface of said fixture body for securing said fixture to a microscope in an orientation in which said chip can be inspected with said microscope.

2. A fixture as claimed in claim 1, further comprising a polishing rate adjusting weight which can be applied to said fixture body in a variety of positions and orientations.

3. A fixture as claimed in claim 2, wherein said weight is applied in said groove and is secured in a position by a screw.

4. A fixture as claimed in claim 1, further comprising spacer pads attached to an underside of said fixture body for spacing said fixture body from a polishing surface when said fixture body is disposed at said polishing station.

5. A fixture as claimed in claim 1, further comprising angle adjusting screws for adjusting the angle of said fixture body with respect to a polishing surface of said polishing station.

6. A fixture as claimed in claim 1, wherein opposite sides of said groove are undercut.

7. A polishing fixture for holding a semiconductor chip during polishing comprising:

a polishing fixture body having a longitudinal axis;

a chip pad removably mounted on said polishing fixture body along said longitudinal axis for receiving said chip and securing said chip to said fixture body in an orientation in which said chip may be polished when said fixture body is disposed at a polishing station;

means on said fixture body for securing said fixture to a microscope in an orientation in which said chip can be inspected with said microscope; and means for adjusting an angle of said longitudinal axis of said fixture body with respect to a polishing surface to control a rate at which said chip on said chip pad is polished.

8. A polishing fixture as claimed in claim 7, wherein said means for adjusting an angle of said longitudinal axis of said fixture body with respect to said polishing surface comprises at least one set screw disposed at an end of said fixture body opposite said chip pad along said longitudinal axis.

9. A polishing fixture as claimed in claim 8, wherein said at least one set screw comprises two set screws which are disposed symmetrically with respect to said longitudinal axis.

10. A method of making a polishing fixture for holding a semiconductor chip during polishing comprising:

forming a polishing fixture body;

forming a chip pad removably mounted on said polishing fixture body for receiving said chip and securing said chip to said fixture body in an orientation in which said chip may be polished when said fixture body is disposed at a polishing station; and carving a groove in the upper surface of said fixture body for securing said fixture to a microscope in an orientation in which said chip can be inspected with said microscope.

11. A method as claimed in claim 10, wherein said step of carving a groove further comprises undercutting opposite sides of said groove.

12. A method as claimed in claim 10, further comprising providing a polishing rate adjusting weight which can be applied to said fixture body in a variety of positions and orientations.

13. A method as claimed in claim 10, further comprising attaching spacer pads to an underside of said fixture body for spacing said fixture body from a polishing surface when said fixture body is disposed at said polishing station.

14. A fixture as claimed in claim 10, further comprising providing angle adjusting screws for adjusting the angle of said fixture body with respect to a polishing surface of said polishing station.

15. A method of making a polishing fixture for holding a semiconductor chip during polishing comprising:

forming a polishing fixture body having a longitudinal axis;

forming a chip pad removably mounted on said polishing fixture body along said longitudinal axis for receiving said chip and securing said chip to said fixture body in an orientation in which said chip may be polished when said fixture body is disposed at a polishing station;

forming a means on said fixture body for securing said fixture to a microscope in an orientation in which said chip can be inspected with said microscope; and forming a means for adjusting an angle of said longitudinal axis of said fixture body with respect to a polishing surface to control a rate at which said chip on said chip pad is polished.

16. A method as claimed in claim 15, wherein said step of forming a means for adjusting an angle of said longitudinal axis of said fixture body with respect to said polishing surface comprises forming at least one set screw disposed at an end of said fixture body opposite said chip pad along said longitudinal axis.

17. A method as claimed in claim 16, wherein said step of providing at least one set screw comprises providing two set screws which are disposed symmetrically with respect to said longitudinal axis.

* * * * *